(12) United States Patent
Bavard et al.

(10) Patent No.: US 9,923,061 B2
(45) Date of Patent: Mar. 20, 2018

(54) SEMICONDUCTOR STRUCTURE WITH ENHANCED WITHSTAND VOLTAGE

(71) Applicant: Commissariat a L'Energie Atomique et aux Energies Alternatives, Paris (FR)

(72) Inventors: Alexis Bavard, Grenoble (FR); Matthew Charles, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/266,125

(22) Filed: Sep. 15, 2016

(65) Prior Publication Data

US 2017/0084697 A1 Mar. 23, 2017

(30) Foreign Application Priority Data

Sep. 17, 2015 (FR) ...................... 15 58766

(51) Int. Cl.
*H01L 21/00* (2006.01)
*H01L 29/00* (2006.01)
(Continued)

(52) U.S. Cl.
CPC ........ *H01L 29/155* (2013.01); *H01L 21/0254* (2013.01); *H01L 21/0257* (2013.01);
(Continued)

(58) Field of Classification Search
CPC ......... H01L 21/02381; H01L 21/02428; H01L 21/0257; H01L 21/0262; H01L 21/02458;
(Continued)

(56) References Cited

U.S. PATENT DOCUMENTS

| 6,764,871 B2 * | 7/2004 | Kawaguchi | ............. C30B 25/02 257/E21.108 |
| 2003/0232457 A1 * | 12/2003 | Kawaguchi | ............. C30B 25/02 438/46 |

(Continued)

FOREIGN PATENT DOCUMENTS

| EP | 2 498 282 A1 | 9/2012 |
| FR | 2 810 159 A1 | 12/2001 |

(Continued)

OTHER PUBLICATIONS

Liou et al., "Vegard's law deviation in band gaps and bowing parameters of the wurtzite III-nitride ternary alloys", 2005, Proceedings of SPIE, vol. 5628, pp. 296-305 (published on Jan. 20, 2005).*

(Continued)

*Primary Examiner* — Nikolay Yushin
(74) *Attorney, Agent, or Firm* — Oblon, McClelland, Maier & Neustadt, L.L.P.

(57) ABSTRACT

A semiconductor structure including a substrate, a buffer layer, a superlattice formed on the buffer layer, the superlattice including a pattern including n layers made of different materials, n being at least equal to 2, each layer including an $Al_xGa_yIn_wB_zN$ type material where $x+y+w+z=1$, the thickness of each layer being less than the critical thickness thereof, the number of patterns being at least equal to 50, an insert layer wherein the material has a first lattice parameter, a layer of GaN material, wherein the lattice parameter is greater than the first lattice parameter such that the layer of GaN material is compressed by the insert layer.

21 Claims, 4 Drawing Sheets

(51) Int. Cl.
  *H01L 29/15* (2006.01)
  *H01L 21/02* (2006.01)
  *H01L 29/778* (2006.01)
  *H01L 29/20* (2006.01)
  *H01L 29/207* (2006.01)

(52) U.S. Cl.
  CPC .... *H01L 21/0262* (2013.01); *H01L 21/02381* (2013.01); *H01L 21/02428* (2013.01); *H01L 21/02433* (2013.01); *H01L 21/02458* (2013.01); *H01L 21/02507* (2013.01); *H01L 21/02579* (2013.01); *H01L 29/7786* (2013.01); *H01L 29/2003* (2013.01); *H01L 29/207* (2013.01); *H01L 29/778* (2013.01)

(58) Field of Classification Search
  CPC . H01L 21/0254; H01L 29/155; H01L 29/778; H01L 29/2003; H01L 29/15
  See application file for complete search history.

(56) References Cited

U.S. PATENT DOCUMENTS

2008/0203382 A1 8/2008 Yanagihara
2012/0223328 A1 9/2012 Ikuta et al.
2013/0026488 A1 1/2013 Miyoshi et al.

FOREIGN PATENT DOCUMENTS

WO WO 2013/001014 A1 1/2013
WO WO 2016/079115 A1 5/2016

OTHER PUBLICATIONS

Gustafsson et al., "Dispersive Effects in Microwave AlGaN/AlN/GaN HEMTs With Carbon-Doped Buffer", 2015, IEEE Transactions on Electron Devices, vol. 62, No. 7 pp. 2162-2169 (Jul. 2015).*

French Preliminary Search Report dated Jul. 4, 2016 in French Application 15 58766, filed Sep. 17, 2015 (with English Translation of Categories of Cited Documents).

Eric Feltin et al. "Stress Control in GaN Grown Silicon (111) by Metalorganic Vapor Phase Epitaxy", Applied Physics Letters, vol. 79, No. 20, Nov. 12, 2001, 4 pages.

* cited by examiner

SEMICONDUCTOR STRUCTURE WITH ENHANCED WITHSTAND VOLTAGE

FIELD OF THE INVENTION AND STATE OF THE RELATED ART

The present invention relates to a semiconductor structure having an enhanced withstand voltage.

Of the various existing semiconductor materials, GaN or Gallium nitride makes it possible to produce good-quality electronic devices.

In order to produce electronic devices comprising GaN at a reasonable cost, it is sought to produce structures comprising one or more layers of GaN on a silicon substrate.

However, GaN and silicon do not have the same lattice parameters or similar or equal thermal expansion coefficients. As such, if no precaution is taken, the GaN obtained is not of good quality and, during cooling after depositing the GaN, cracks appear in the GaN layer(s). In order to remedy this drawback, one or more buffer layers are inserted between the substrate and the GaN layer(s), the latter applying compressive stress in the GaN, which during cooling prevents the appearance of cracks in the GaN layer. Furthermore, the presence of the buffer layer(s) prevents the GaN from being in contact with the silicon, which otherwise would cause the appearance of crystalline defects in the GaN.

The material of the buffer layer is for example AlN.

It is moreover sought to produce a layer of GaN having a sufficient thickness required for most applications.

The document WO2013001014 describes a semiconductor structure comprising a thick GaN layer. This thick GaN layer is obtained by producing, on an AlN buffer layer formed on a monocrystalline silicon substrate, a 3D GaN layer which is intended to enhance the quality of the GaN layers. A good-quality thick GaN layer may then be produced on this layer of 3D GaN after inserting an insert layer.

One of the applications of the semiconductor structures comprising a GaN layer is power electronics, notably the production of high-power transistors. In this application, it is sought to obtain a very low vertical leakage current, i.e. in the layer stacking height.

However, the 3D GaN layer does not offer sufficient vertical electrical insulation.

DESCRIPTION OF THE INVENTION

Consequently, one aim of the present invention is that of offering a semiconductor structure comprising a layer of GaN, more generally of III-N type material, offering a satisfactory withstand voltage so as to be suitable for example for the production of high-power transistors while having a sufficiently thick layer of GaN, more generally of III-N type material, and of sufficient quality.

The aim mentioned above is achieved by a semiconductor structure comprising a substrate, a buffer layer, at least one superlattice formed on the buffer layer, an insert layer, a GaN layer compressed by the insert layer, the superlattice comprising a pattern comprising n layers of different materials, n being an integer greater than or equal to 2, the pattern being repeated a large number of times. Each layer of the pattern comprises an $Al_xGa_yIn_wB_zN$ type material where $x+y+w+z=1$ and has a thickness less than the critical thickness of the material whereof it is formed. Preferably, the pattern is repeated at least 50 times.

Advantageously, the structure comprise at least 100 patterns.

Very advantageously, the thickness of each layer is between 0.5 nm and 5 nm and preferably less than or equal to 1 nm. Preferably, the thickness of the pattern is less than or equal to 5 nm.

In the present application, a superlattice is a periodic multilayer structure formed by the repetition of an elementary pattern comprising at least two chemically different successive layers.

According to the invention, the primary aim of the superlattice is not that of compressing the III-N which is formed on the superlattice but that of providing vertical electrical insulation, notably due to a large number of interfaces between the layers of the superlattice. The application of compressive stress is performed by said insert layer. The invention thus makes it possible to decorrelate the electrical insulation and compressive stress functions on the thick active layer of III-N, which makes it possible to optimise the electrical insulation and compression substantially independently.

This decorrelation further offers a certain freedom on the composition of the layers of the lattice, which makes it possible to have aluminium-rich layers having higher energy bandwidths than that of GaN.

Moreover, the superlattice may reduce the dislocation density, which further facilitates the formation of thick GaN on the insert. Moreover, due to the fine thicknesses involved, there is no occurrence of two-dimensional electron gas between the superlattice and the AlN insert layer, unlike a stack of GaN and AlN.

Advantageously, at least one additional layer is envisaged between the insert layer and the layer of III-N, wherein the material has a lattice parameter between that of the material of the insert layer and the layer of III-N, as such, the lattice parameter of the insert layer is progressively increased to the layer of III-N.

The subject-matter of the present invention then is a semiconductor structure comprising at least:

a substrate, a buffer layer, a superlattice formed on the buffer layer, said superlattice comprising a pattern comprising n layers made of different materials, n being an integer at least equal to 2, each layer comprising an $Al_xGa_yIn_wB_zN$ type material where $x+y+w+z=1$, the thickness of each layer being less than the critical thickness thereof, the number of patterns being at least equal to 50, an insert layer wherein the material has a first lattice parameter, a layer of III-N type material, wherein the lattice parameter is greater than the first lattice parameter such that the layer of III-N type material is compressed by the insert layer.

Preferably, the thickness of each layer of the superlattice is less than or equal to 5 nm, more preferably equal to 1 nm.

The thickness of each pattern is advantageously less than or equal to 5 nm.

The structure may comprise at least one layer of $Al_xGa_yIn_wB_zN$ type material where $x+y+w+z=1$ between the insert layer and the layer of III-N type material having a second lattice parameter greater than the first lattice parameter and less than the lattice parameter of the III-N type material.

The insert layer preferably has a thickness at least equal to 10 nm and may be a layer of AlN. Alternatively, the insert layer is a superlattice.

The substrate may advantageously comprise monocrystalline silicon.

According to a further example, the structure comprises at least one additional layer of III-N type material inserted between the superlattice and the insert layer and/or at least one additional layer of III-N type material inserted between the insert layer and the layer of III-N material. This additional layer preferably has a thickness of at least 50 nm.

The structure may comprise a plurality of overlaid superlattices.

Preferably, the III-N type material is Gallium nitride.

Another subject-matter of the present invention is a transistor comprising a structure according to the invention, said transistor being for example a HEMT transistor.

Another subject-matter of the present invention is a method for producing a semiconductor structure comprising the following steps from a substrate:
a) formation of a buffer layer,
b) formation of a superlattice comprising the substeps:
b1) producing a pattern comprising n layers, n being at least equal to 2, each layer comprising an $Al_xGa_yIn_wB_zN$ type material where $x+y+w+z=1$, the thickness of each layer being less than the critical thickness thereof,
b2) repetition of step b1) at least 50 times,
c) formation of an insert layer having a first lattice parameter
d) formation of a layer of III-N type material wherein the lattice parameter is greater than the first lattice parameter.

During step b), carbon is advantageously incorporated in the layers of the superlattice.

Preferably, the layers of the structure are formed by growth, advantageously by metalorganic vapour phase epitaxy.

BRIEF DESCRIPTION OF THE FIGURES

The present invention will be understood more clearly on the basis of the description hereinafter and the appended drawings wherein.

The different parts represented in the figures are not necessarily represented to a uniform scale, in order to render the figures more legible.

DETAILED DESCRIPTION OF PARTICULAR EMBODIMENTS

The description hereinafter will relate to semiconductor structures comprising a thick layer of GaN to which compressive stress is applied. However, the present invention relates more generally to any semiconductor structure comprising a layer of III-N type material, i.e. made of a nitride of a material from column III of the periodic table such as boron, indium, etc. Consequently, hereinafter in the description, when it is sought to produce a structure comprising a III-N type layer instead of GaN, it is simply necessary to replace Gallium by the type III material in the various layers.

Figure 1:
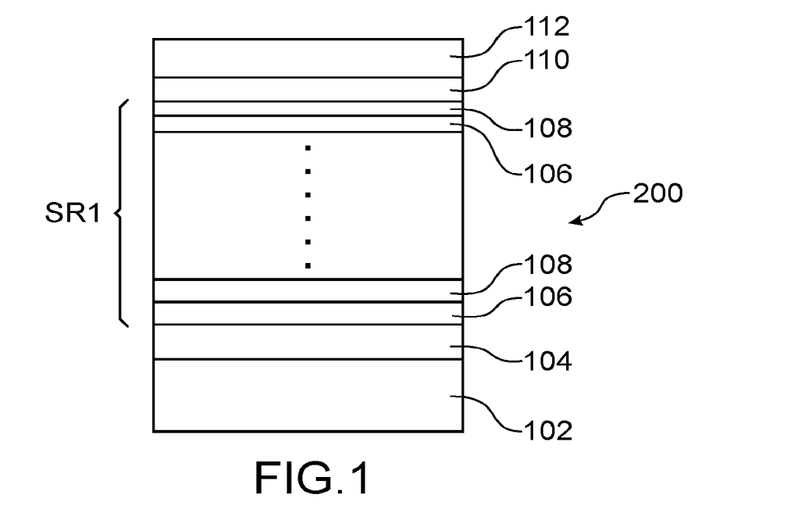
FIG. 1 is a schematic representation of an example of a semiconductor structure according to the invention.

In FIG. 1, an example of a semiconductor structure 100 according to the invention comprising a stack of a plurality of layers.

The stack comprises a substrate 102 forming the base of the stack. The substrate 102 is for example made of monocrystalline silicon for example of type (111). The thickness of the substrate is for example between 500 µm and 2 mm. Alternatively, the substrate 102 could be made for example of sapphire, which makes it possible to avoid conduction layers at the interface between the GaN and the sapphire.

The stack also comprises a buffer layer 104 formed on the substrate 102. This buffer layer 104 acts as a nucleation layer for the growth of the other layers. The buffer layer comprises for example AlN and has a thickness for example between 50 nm and 500 nm, and preferably between 200 nm and 300 nm. This buffer layer also has the role of insulating the substrate from the layer(s) of GaN subsequently formed. Alternatively, the buffer layer may comprise SiC.

The stack also comprises a superlattice SR1 formed on the buffer layer 104.

As mentioned above, a superlattice is a periodic multilayer structure formed by the repetition, a large number of times, of an elementary pattern comprising at least two chemically different successive layers. The superlattice preferably comprises at least 50 elementary patterns.

In the example in FIG. 1, the superlattice SR1 according to the invention comprises a pattern comprising two layers, one $Al_{x1}Ga_{y1}In_{w1}B_{z1}N$ layer 106 where $x_1+y_1+w_1+z_1=1$ and one $Al_{x2}Ga_{y2}In_{w2}B_{z2}N$ layer 108 where $x_2+y_2+w_2+z_2=1$. The materials of two successive layers in the superlattice are different. For example, the values of $x_1$ and $x_2$ are different, $y_1$ and $y_2$ are different, $w_1$ and $w_2$ are different and $z_1$ and $z_2$ are different.

Moreover, the layers 106 and 108 have thicknesses less than the critical thicknesses. As such, the layers 106 and 108 have very low dislocation densities. The critical thicknesses are equal to not more than 5 nm.

In the application, the critical thickness is the thickness above which the material of a layer begins to relax and then to have its lattice parameter when there is no strain.

For example, the thicknesses of the layers 106 and 108 are between 0.5 nm and 5 nm, and preferably less than or equal to 1 nm. Preferably, the thickness of the pattern, i.e. the sum of the thicknesses of the layers 106 and 108 is less than or equal to 5 nm. The two layers may have equal or different thicknesses. The stack also comprises an insert layer 110 formed on the superlattice SR1 suitable for applying compressive stress to a layer of GaN 112 formed on the insert layer 110.

The insert layer 110 comprises a material having a lattice parameter less than that of GaN in order to apply to the GaN sufficient compressive stress for producing a thick layer of GaN comprising no cracks. The insert layer 110 has for example a thickness between 5 nm and 50 nm and preferably equal to 17 nm. For example, the insert layer 110 is made of AlN.

The GaN layer 112 has for example a thickness of 3 µm.

By way of example, it is possible to produce a superlattice comprising 340 repetitions of a pattern comprising a layer 106 of GaN and a layer 108 of $Al_{0.5}Ga_{0.5}N$, each layer having a thickness of 1 nm.

Due to the very large number of interfaces of the superlattice SR1, the electrical resistance of the superlattice is very high. Therefore, this provides electrical insulation in the stack between the GaN layer 112 and the substrate 102.

As mentioned above, the function of the superlattice is not that of applying compressive stress to the GaN layer but that of providing the electrical insulation between the GaN layer, more specifically the electronic component formed on the GaN layer and the substrate.

This structure has a very good withstand voltage, for example of several hundred volts. As such, current leakages in the stack are substantially reduced. The structure may then be used in high-power electronics, for example for producing HEMT (High-electron-mobility transistor) transistors or Schottky diodes.

Moreover, a GaN layer having a high crystallographic quality, i.e. having few defects, is obtained.

Furthermore, by means of the invention, electrical insulation and application of compressive stress to the GaN layer are decorrelated, which offers greater freedom in the choice of aluminium composition of the layers 106 and 108. It is then possible to have aluminium-rich layers of the elementary pattern, which is favourable for obtaining high electrical insulation, since AlGaN alloys have a higher energy bandwidth than GaN Moreover, the invention advantageously makes it possible to incorporate carbon in large quantities in the stack, which increases the withstand voltage further. For example, carbon may be incorporated directly in the layers of the superlattice during the formation thereof in a manner known to those skilled in the art, for example during growth of the layers 106 and 108 by metalorganic vapour phase epitaxy or MOCVD (Metalorganic Chemical Vapour Deposition). Incorporating carbon in large quantities in the superlattice does not have the effect of impairing crystalline quality unlike the structures according to the prior art. The carbon concentration is for example equal to approximately more than $5.10^{18}$.

Moreover, it may be envisaged to produce a plurality of superlattices according to the invention, on top of one another, the compositions of the layers of the patterns varying from one lattice to another. It may be envisaged to have superlattice compositions which vary in a given direction between the superlattice situated closest to the substrate and that situated closest to the GaN layer.

The combination of a plurality of superlattices according to the invention makes it possible to increase the withstand voltage of the structure further.

Alternatively, the AlN insert layer may be replaced by a superlattice suitable for applying a compressive stress to the GaN layer which will be produced on the superlattice. For example, the compositions of the layers are chosen such that that the average lattice composition is high in AlGaN, for example of the order of 80%.

Further examples of semiconductor structures according to the invention will now be described.

Figure 2:
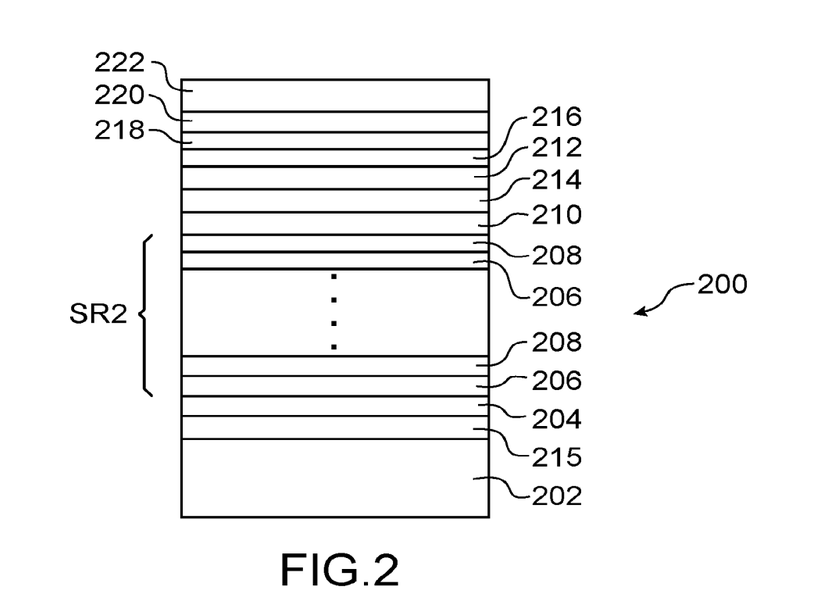
FIG. 2 is a schematic representation of a further example of a semiconductor structure according to the invention.

In FIG. 2, a further example of a semiconductor structure 200 can be seen. The structure 200 comprises a substrate 202, for example made of type (111) Si, a buffer layer 204 for example made of AlN, a superlattice SR2 similar to the superlattice SR1 of the structure 100, an insert layer 210 similar to the insert layer 110, a layer 214 wherein the material has a lattice parameter less than that of GaN but greater than that of the material of the insert layer 210. By inserting the layer 214 between the insert layer and the GaN layer, the difference in the lattice parameter between the insert layer 210 and the GaN is progressively reduced. Adding the layer 214 has the effect of retaining compression better in the layers, enabling the growth of a thicker GaN layer with no cracking during cooling. For example, the layer 214 is a layer of AlGaN wherein the thickness is for example between 50 nm and 1000 nm, preferably equal to 200 nm. As a variant the layer 214 can be a superlattice.

Alternatively, it is possible to envisage inserting more than one layer of AlGaN between the insert layer and the GaN layer 312, these layers then being arranged such that the lattice parameter thereof is increasing from the layer in contact with the insert layer 210 to the layer whereon the GaN layer 212 is formed.

Moreover, in the example represented, a layer of AlGaN 215 is formed between the buffer layer 204 and the superlattice SR2. The superlattice SR2 plays the same role as an AlGaN, i.e. it helps transmit compression from the AlN to the GaN. Moreover, the superlattice SR2 is more resistive than an AlGaN, as is the case for the superlattice SR1. The layer 215 has for example a thickness equal to 0.5 μm.

In the example represented, the structure also comprises a layer of GaN 216 formed on the layer of GaN 212 forming a channel, a layer 218 of AlN, a layer of AlGaN 220 and a layer of GaN 222.

In the case of a superlattice comprising 340 repetitions of a pattern comprising a layer 106 of GaN and a layer 108 of $Al_{0.5}Ga_{0.5}N$, each layer having a thickness of 1 nm, the structure 200 has for example a thickness of 4.8 μm.

Alternatively, the layer 214 of AlGaN may be replaced by a superlattice which has the same function as the layer of AlGaN 214.

Figure 3:
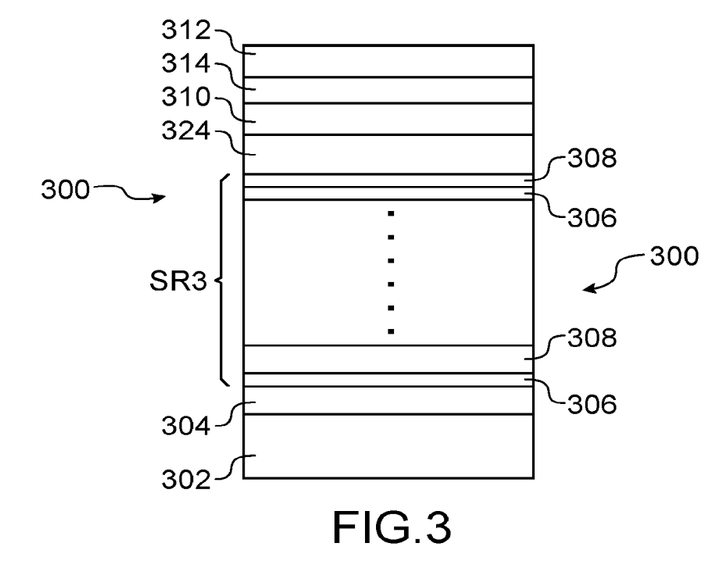
FIG. 3 is a schematic representation of a further example of a semiconductor structure according to the invention.

In FIG. 3, a further example of a semiconductor structure 300 can be seen. The structure 300 comprises a substrate 302 for example made of type (111) Si, a buffer layer 304 for example made of AlN, a superlattice SR3 similar to the superlattice SR1 of the structure 100, a GaN layer 324 formed on the superlattice SR3, an insert layer 310 formed on the layer 324, the insert layer being similar to the insert layer 110, a layer 314 similar to the layer 214.

The GaN of the layer 324 is a so-called 2D or two-dimensional GaN layer i.e. no roughness is generated, there are no "3D" blocks and the surface remains flat. The formation of such a layer is well-known to those skilled in the art. Producing a stack of a layer of 2D GaN and a layer of AlN has the advantage of having embedded cracks appear at the interface between the GaN and the AlN which contribute to the compression of the GaN layer 312. As a variant AlN can be replaced by $Al_xIn_yB_zGa_wN$ with $x+y+z+w=1$, which has a lattice parameter lower than those of the two adjacent layers. As another variant, AlN could be replaced by SiC, but the effect of SiC is less efficient than the effect of AlN or $Al_xIn_yB_zGa_wN$.

The GaN layer 324 has a thickness for example between 50 nm and 2000 nm, preferably equal to 500 nm.

The pattern of the superlattice may comprise more than two layers, it may comprise n layers, $n \geq 2$, the composition of the layer n may then be expressed as $Al_{xn}Ga_{1-xn}N$, where xn belongs to the interval [0; 1].

As a variant the stack 324-310-314 is repeated.

Figure 4:
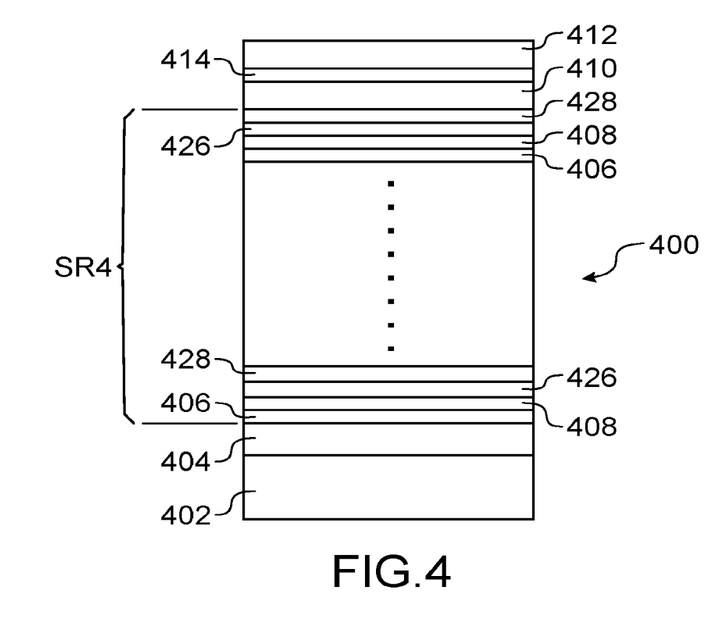
FIG. 4 is a schematic representation of a further example of a semiconductor structure according to the invention.

In FIG. 4, a further example of a semiconductor structure 400 can be seen wherein n=4. The structure 400 comprises a substrate 402, a buffer layer 404 and a superlattice SR4. The pattern of the superlattice comprises four layers 406, 408, 426, 428.

The layer 406 comprises the material $Al_{x1}Ga_{y1}In_{w1}B_{z1}N$ where $x_1+y_1+w_1+z_1=1$. The layer 408 comprises the material $Al_{x2}Ga_{y2}In_{w2}B_{z2}N$ where $x_2+y_2+w_2+z_2=1$. The layer 426 comprises the material $Al_{x3}Ga_{y3}In_{w3}B_{z3}N$ where $x_3+y_3+w_3+z_3=1$. The layer 428 comprises the material $Al_{x4}Ga_{y4}In_{w4}B_{z4}N$ where $x_4+y_4+w_4+z_4=1$. The materials of two successive layers in the superlattice are different. Each layer has a thickness less than the critical thickness. The structure 400 also comprises an insert layer 410 formed on the superlattice SR4, the insert layer 410 being similar to the insert layer 110, a layer 414 similar to the layer 214.

Preferably, the pattern has a thickness less than 5 nm. The superlattice SR4 comprises a large number of patterns, preferably at least 50.

Figure 5:
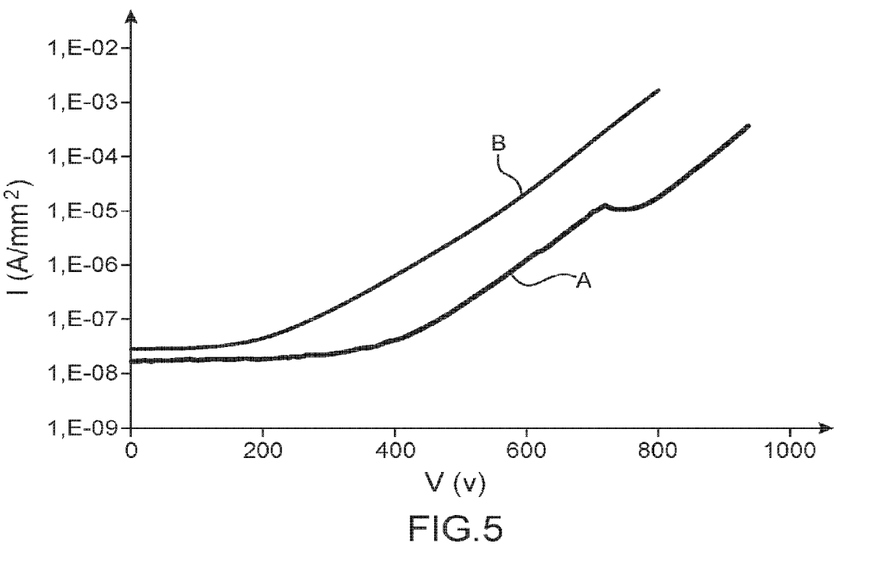
FIG. 5 is a graphic representation of the variation of the vertical leakage current according to the voltage applied in a semiconductor structure according to one particular embodiment of the invention and in a structure comprising 3D GaN.

In FIG. 5, a graphic representation of the variation of the vertical leakage current I in A/mm² as a function of the voltage V in Volts applied via the stack of a structure according to the invention (curve A) and a structure comprising 3D GaN instead of the superlattice (curve B) can be seen. It is observed that, by means of the invention, the vertical leakage current is reduced.

Regardless of the example of an embodiment or alternative embodiment, the various layers of the semiconductor structure are produced by growth, for example by metalorganic vapour phase epitaxy, notably the layers of the superlattice(s), by vapour phase chemical deposition or MOCVD (Metalorganic Chemical Vapour Deposition) or by MBE (Molecular Beam Epitaxy).

Figure 6:
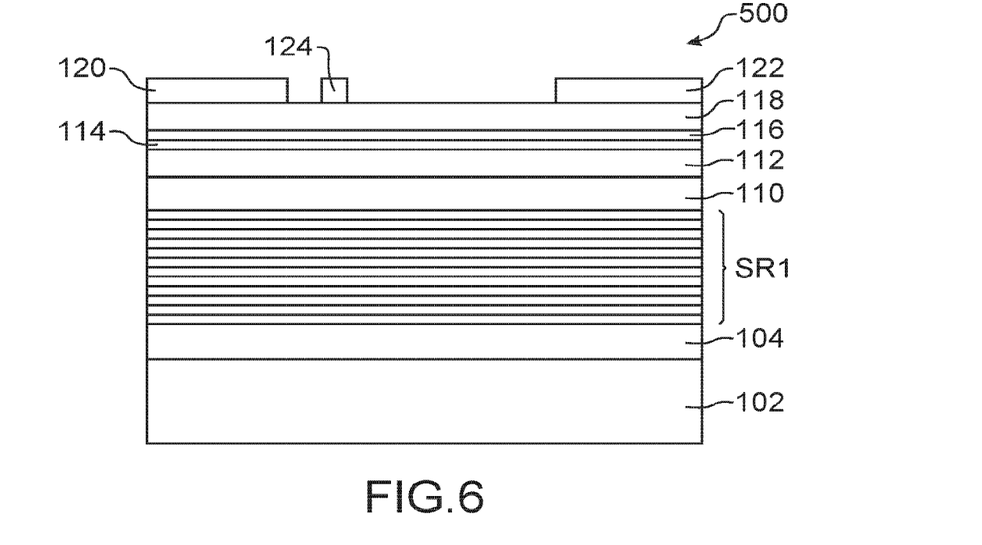
FIG. 6 represents schematically a power transistor formed on a semiconductor structure according to a particular embodiment of the invention.

By way of example, for the growth of the layers by MOCVD, the typical temperature is in the region of 1000° C., a pressure of 100 mbar, in hydrogen with a partial ammonia pressure of 30 mbar The GaN layer 112 obtained may be used as an active layer of semiconductor devices produced using the substrate formed by the structure 200. For example, a HEMT transistor 300 may be produced using the GaN layer 112, as represented schematically in FIG. 6. This layer 112 is doped, for example with carbon and with a concentration for example equal to approximately $10^{19}$ cm$^{-3}$. An additional layer 114 comprising a semiconductor similar to that of the layer 112 and thinner than the layer 112 (thickness for example equal to approximately 100 nm, or between approximately 25 nm and 1 µm), and also comprising carbon as a dopant with a concentration for example equal to approximately $5.10^{16}$ cm$^{-3}$, is formed on the layer 112. This additional layer 114 of GaN is intended to form the channel of the HEMT transistor 500. A spacer layer 116 comprising for example AlN and having a thickness equal to approximately 1 nm, is then arranged on the additional layer 114 of GaN. Finally, a layer of AlGaN 118, comprising for example a gallium content equal to approximately 80% and suitable for carrying out the formation of a two-dimensional electron gas in the channel of the transistor 300, is formed on this spacer layer 116. The HEMT transistor 300 is then completed using conventional steps such as the formation of the source 120 and drain 122 regions, the metal contacts, the gate 124, etc.

It will be understood that the various examples of embodiments and the various alternative embodiments may be combined without leaving the scope of the present invention.

The semiconductor structure according to the invention is particularly suitable for producing high-power transistors due to the high withstand voltage, for example for producing HEMT. However, it may also be used in the production of light-emitting diode structures, the GaN layer 112 is used as an active layer of a light-emitting diode 600 as represented for example in FIG. 7. In this case, the layer 112 may be n-doped for example with silicon. A quantum well structure 126 comprising barrier layers of GaN and emissive layers of InGaN is then formed on the layer 112. A p-doped GaN layer 128, for example with magnesium may finally be produced on the quantum well structure 126.

Figure 7:
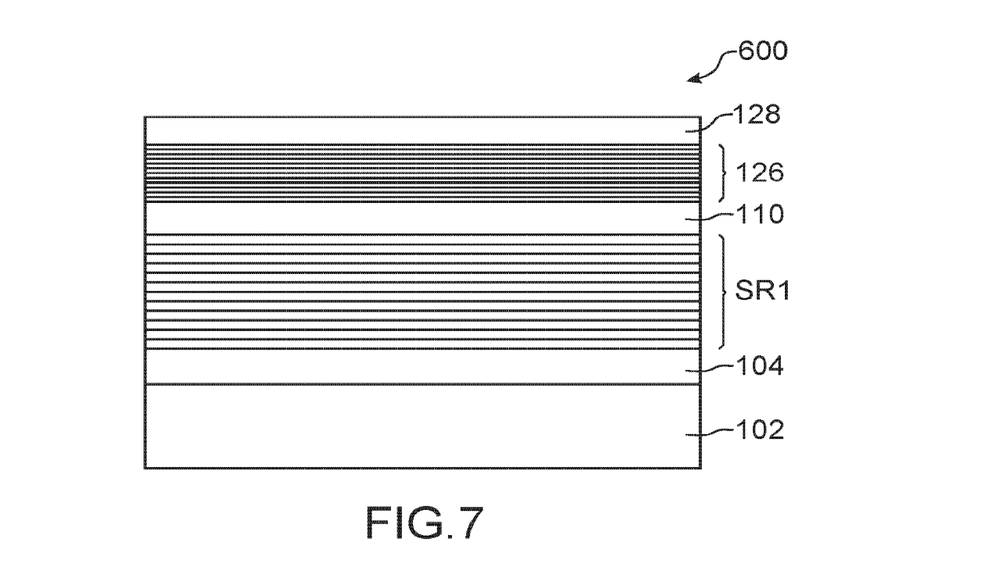
FIG. 7 represents schematically a light-emitting diode formed on a semiconductor structure according to a particular embodiment of the invention.

A current circulating between the layers 112 and 128 induces an emission the wavelength of which corresponding to the forbidden gap of InGaN in the wells.

The invention claimed is:

1. A semiconductor structure comprising at least:
    a substrate,
    a buffer layer,
    a superlattice formed on the buffer layer, said superlattice comprising a pattern comprising n layers made of different materials, n being an integer at least equal to 2, each layer comprising an $Al_xGa_yIn_wB_zN$ type material where $x+y+w+z=1$, the thickness of each layer being less than the critical thickness thereof, the number of patterns being at least equal to 50,
    a GaN layer formed on the superlattice wherein said GaN layer comprises a stack comprising a two-dimensional GaN layer and layer of AlN,
    an insert layer wherein the material has a first lattice parameter,
    a layer of III-N type material, wherein the lattice parameter is greater than the first lattice parameter such that the layer of III-N type material is compressed by the insert layer.

2. The semiconductor structure according to claim 1, wherein the thickness of each layer of the superlattice is less than or equal to 5 nm.

3. The semiconductor structure according to claim 1, wherein the thickness of each pattern is less than or equal to 5 nm.

4. The semiconductor structure according to claim 1, comprising at least one layer of $Al_xGa_yIn_wB_zN$ type material where $x+y+w+z=1$ between the insert layer and the layer of III-N type material having a second lattice parameter greater than the first lattice parameter and less than the lattice parameter of the III-N type material.

5. The semiconductor structure according to claim 1, wherein the insert layer has a thickness at least equal to 10 nm.

6. The semiconductor structure according to claim 1, wherein the insert layer is a layer of AlN.

7. The semiconductor structure according to claim 1, wherein the insert layer is a superlattice.

8. The semiconductor structure according to claim 1, wherein the substrate comprises monocrystalline silicon.

9. The semiconductor structure according to claim 1, comprising at least one additional layer of III-N type material inserted between the superlattice and the insert layer and/or at least one additional layer of III-N type material inserted between the insert layer and the layer of III-N material.

10. The semiconductor structure according to claim 9, wherein the additional layer of III-N type material has a thickness of at least 50 nm.

11. The semiconductor structure according to claim 1, comprising a plurality of overlaid superlattices.

12. The semiconductor structure according to claim 1, wherein the III-N type material is Gallium nitride.

13. A transistor comprising at least one semiconductor structure according to claim 1.

14. The transistor according to claim 13, said transistor being a HEMT transistor.

15. A method for producing a semiconductor structure comprising the following steps from a substrate:
  a) formation of a buffer layer,
  b) formation of a superlattice comprising the substeps:
    b1) producing a pattern comprising n layers, n being at least equal to 2, each layer comprising an $Al_xGa_yIn_wB_zN$ type material where $x+y+w+z=1$, the thickness of each layer being less than the critical thickness thereof,
    b2) repetition of step b1) at least 50 times,
  c) formation of a GaN layer on the superlattice wherein said GaN layer comprises a stack comprising a two-dimensional GaN layer and layer of AlN,
  d) formation of an insert layer having a first lattice parameter
  e) formation of a layer of III-N type material wherein the lattice parameter is greater than the first lattice parameter.

16. The method for producing a semiconductor structure according to claim 15, wherein during step b), carbon is incorporated in the layers of the superlattice.

17. The method for producing a semiconductor structure according to claim 15, wherein the layers of the structure are formed by growth, advantageously by metalorganic vapour phase epitaxy.

18. A semiconductor structure comprising at least:
  a substrate,
  a buffer layer,
  a plurality of superlattices formed on the buffer layer, said each superlattice independently comprises a pattern comprising n layers made of different materials, n being an integer at least equal to 2, each layer comprising an $Al_xGa_yIn_wB_zN$ type material where $x+y+w+z=1$, the thickness of each layer being less than the critical thickness thereof, the number of patterns being at least equal to 50,
  an insert layer wherein the material has a first lattice parameter,
  a layer of III-N type material, wherein the lattice parameter is greater than the first lattice parameter such that the layer of III-N type material is compressed by the insert layer.

19. The semiconductor structure according to claim 18, wherein each superlattice are of the same type.

20. The semiconductor structure according to claim 18, wherein each superlattice is in contact with the next successive superlattice.

21. A semiconductor structure comprising at least:
  a substrate,
  a buffer layer,
  a superlattice formed on the buffer layer, said superlattice comprising a pattern comprising n layers made of different materials, n being an integer at least equal to 2, each layer comprising an $Al_xGa_yIn_wB_zN$ type material where $x+y+w+z=1$, the thickness of each layer being less than the critical thickness thereof, the number of patterns being at least equal to 50,
  an insert layer wherein the material has a first lattice parameter,
  a layer of III-N type material, wherein the lattice parameter is greater than the first lattice parameter such that the layer of III-N type material is compressed by the insert layer, and
  at least one layer of $Al_xGa_yIn_wB_zN$ type material where $x+y+w+z=1$ between the insert layer and the layer of III-N type material having a second lattice parameter greater than the first lattice parameter and less than the lattice parameter of the III-N type material.

* * * * *